(12) United States Patent
Safaee et al.

(10) Patent No.: US 10,172,237 B1
(45) Date of Patent: Jan. 1, 2019

(54) SPACE-EFFICIENT PCB-BASED INDUCTOR

(71) Applicants: Alireza Safaee, Cupertino, CA (US); Thomas Dreeben, Swampscott, MA (US); John Cross, Needham, MA (US)

(72) Inventors: Alireza Safaee, Cupertino, CA (US); Thomas Dreeben, Swampscott, MA (US); John Cross, Needham, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/687,996

(22) Filed: Aug. 28, 2017

(51) Int. Cl.
*H01F 27/06* (2006.01)
*H05K 1/16* (2006.01)
*H01F 27/00* (2006.01)

(52) U.S. Cl.
CPC ........... *H05K 1/165* (2013.01); *H01F 27/006* (2013.01)

(58) Field of Classification Search
CPC .......... H01F 27/06; H01F 27/24; H01F 27/28; H01F 27/29; H01F 5/00
USPC ......... 174/260; 336/180, 200; 324/127, 210, 324/260
See application file for complete search history.

(56) References Cited

U.S. PATENT DOCUMENTS

| | | | | |
|---|---|---|---|---|
| 4,414,507 A * | 11/1983 | Chen | ..................... | G11C 19/085 324/210 |
| 5,726,611 A * | 3/1998 | Takagi | ..................... | H01F 17/06 333/181 |
| 5,877,666 A * | 3/1999 | Johnson, Jr. | ......... | H01F 17/0006 336/180 |
| 6,313,623 B1 * | 11/2001 | Kojovic | ............... | G01R 15/181 324/127 |
| 6,975,199 B2 * | 12/2005 | Long | ....................... | H01F 5/003 257/E27.046 |
| 7,088,215 B1 * | 8/2006 | Winter | ................ | H01F 17/0033 29/602.1 |
| 7,868,722 B2 * | 1/2011 | Hwang | ................. | H01F 17/062 336/200 |
| 8,068,004 B1 * | 11/2011 | Chong | ................ | H01F 17/0013 29/602.1 |
| 9,293,245 B2 * | 3/2016 | Stephanou | ............... | H01F 27/24 |
| 9,823,274 B2 * | 11/2017 | Lint | ...................... | G01R 15/181 |
| 2002/0084715 A1 * | 7/2002 | Kakuta | .............. | G11B 19/2009 310/216.008 |
| 2005/0052268 A1 * | 3/2005 | Pleskach | ............. | H01F 17/0033 336/200 |
| 2005/0229385 A1 * | 10/2005 | Pleskach | ............. | H01F 17/0033 29/602.1 |
| 2006/0273873 A1 * | 12/2006 | Chen | ..................... | H01F 17/045 336/200 |

(Continued)

*Primary Examiner* — Xiaoliang Chen
(74) *Attorney, Agent, or Firm* — Yutian Ling (57) ABSTRACT

A space-efficient Printed Circuit Board (PCB)-based inductor includes a first set of inductor turns formed on the printed circuit board and arranged to form a first toroidal end section, a second set of inductor turns formed on the printed circuit board and arranged to form a first cylindrical side section, a third set of inductor turns formed on the printed circuit board and arranged to form a second toroidal end section, and a fourth set of inductor turns formed on the printed circuit board and arranged to form a second cylindrical side section. The first toroidal end section, first cylindrical side section, second toroidal end section, and second cylindrical side section are connected in series.

8 Claims, 6 Drawing Sheets

(56) References Cited

U.S. PATENT DOCUMENTS

| | | | |
|---|---|---|---|
| 2007/0146108 A1* | 6/2007 | Hwang | H01F 17/062 336/200 |
| 2009/0085706 A1* | 4/2009 | Baarman | H01F 5/003 336/200 |
| 2013/0057276 A1* | 3/2013 | Klein | G01R 33/0052 324/260 |
| 2013/0143381 A1* | 6/2013 | Kikukawa | H01F 17/02 438/381 |
| 2013/0214890 A1* | 8/2013 | Zabaco | H01F 17/0013 336/200 |
| 2013/0271073 A1* | 10/2013 | Yang | H01F 5/00 320/108 |
| 2014/0131932 A1* | 5/2014 | Balsells | F16F 1/045 267/167 |
| 2015/0035638 A1* | 2/2015 | Stephanou | H01F 27/24 336/200 |
| 2016/0181003 A1* | 6/2016 | Li | H01F 27/022 336/200 |
| 2016/0372259 A1* | 12/2016 | Banba | H01F 41/04 |
| 2017/0084384 A1* | 3/2017 | Otsubo | H01F 17/06 |
| 2017/0149356 A1* | 5/2017 | Biglarbegian | H01F 27/2804 |

* cited by examiner

SPACE-EFFICIENT PCB-BASED INDUCTOR

TECHNICAL FIELD

This present application relates to inductors and more particularly to a space-efficient Printed Circuit Board (PCB)-based inductor.

BACKGROUND

Inductor design involves an arrangement of a coiled conductor wrapped around a core, in which the core can be a magnetic material or a non-magnetic material. Printed Circuit Board (PCB) technology has been improving for many decades and provides repeatability, low tolerance, and manufacturability for electronic designs. Accordingly, various attempts have been made at forming PCB-based inductors. Unfortunately conventional PCB based inductor designs are not space-efficient which may impede efforts to reduce the overall size of electronic devices incorporating the PCBs.

SUMMARY

All examples and features mentioned below may be combined in any technically possible way. Various implementations described herein include a space-efficient inductor. In some embodiments, the space-efficient inductor is a PCB-based inductor.

In some embodiments, a space-efficient Printed Circuit Board (PCB)-based inductor includes a first set of inductor turns formed on the printed circuit board and arranged to form a first toroidal end section, a second set of inductor turns formed on the printed circuit board and arranged to form a first cylindrical side section, a third set of inductor turns formed on the printed circuit board and arranged to form a second toroidal end section, and a fourth set of inductor turns formed on the printed circuit board and arranged to form a second cylindrical side section. The first toroidal end section, first cylindrical side section, second toroidal end section, and second cylindrical side section are connected in series.

In some embodiments, the first toroidal end section has turns that radiate generally outwardly from a first approximate central focal point, and the second toroidal end section has turns that radiate generally outwardly from a second approximate central focal point. In some embodiments, the turns of the first toroidal end section and the turns of the second toroidal end section extend through an arc encompassing approximately 180 degrees of a circle. In some embodiments, at least some of the turns of the second set of inductor turns are longer than at least some of the turns of the first set of inductor turns. In some embodiments, the turns of the first and third sets of inductor turns each has a first length, the turns of the second and fourth sets of inductor turns each has a second length, and the second length is longer than the first length. In some embodiments, the first cylindrical side section is connected between the first and second toroidal end sections, and the second cylindrical side section is connected between the second and first toroidal end sections. In some embodiments, each turn is formed from a top trace, a bottom trace, an inner via, and an outer via, at least one of the inner via and the outer via interconnecting the top trace and bottom trace. In some embodiments, the top and bottom traces of the turns in the first and second cylindrical side sections are longer than top and bottom traces of the turns in the first and second toroidal end sections. In some embodiments, the top traces and bottom traces of the first toroidal end section are the same length as the top traces and bottom traces of the second toroidal end section.

In another aspect, an inductor includes a first set of inductor turns arranged to form a first toroidal end section, a second set of inductor turns arranged to form a first cylindrical side section, a third set of inductor turns arranged to form a second toroidal end section, and a fourth set of inductor turns arranged to form a second cylindrical side section. The first toroidal end section, first cylindrical side section, second toroidal end section, and second cylindrical side section are connected in series.

In some embodiments, the first toroidal end section has turns that radiate generally outwardly from a first approximate central focal point, and the second toroidal end section has turns that radiate generally outwardly from a second approximate central focal point. In some embodiments, the turns of the first toroidal end section and the turns of the second toroidal end section extend through an arc encompassing approximately 180 degrees of a circle. In some embodiments, at least some of the turns of the second set of inductor turns are longer than at least some of the turns of the first set of inductor turns. In some embodiments, the turns of the first and third sets of inductor turns each has a first length, the turns of the second and fourth sets of inductor turns each has a second length, and the second length is longer than the first length. In some embodiments, the first cylindrical side section is connected between the first and second toroidal end sections, and the second cylindrical side section is connected between the second and first toroidal end sections. In some embodiments, each turn is formed from a top wire, a bottom wire, an inner connector, and an outer connector, at least one of the inner connector and the outer connector interconnecting the top wire and bottom wire. In some embodiments, the top and bottom wires of the turns in the first and second cylindrical side sections are longer than top and bottom wires of the turns in the first and second toroidal end sections. In some embodiments, the top wires and bottom wires of the first toroidal end section are the same length as the top wires and bottom wires of the second toroidal end section.

Figure 8:
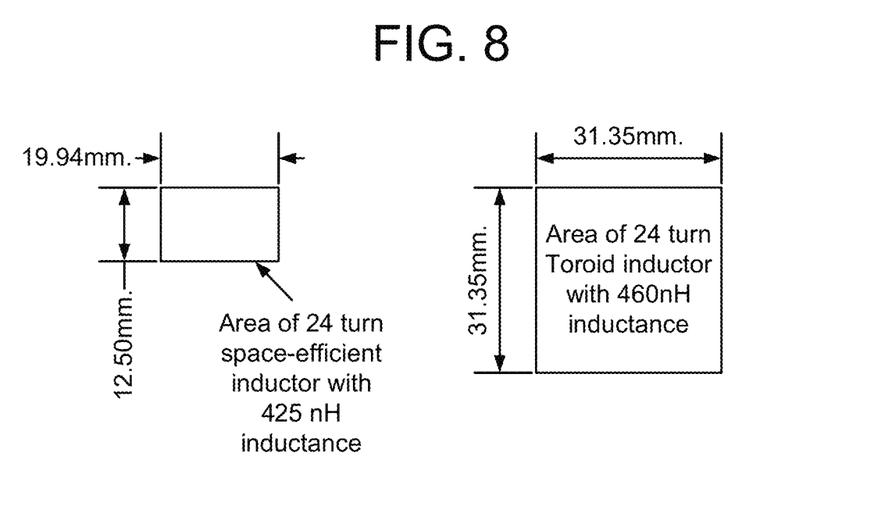
FIG. 8 is a scale drawing of the space occupied by an example space-efficient PCB-based inductor of FIGS. 1-6 and the example comparison toroidal PCB-based inductor of FIG. 7, for inductors having similar inductance values.

These and other features of the present embodiments will be understood better by reading the following detailed description, taken together with the figures herein described. The accompanying drawings, with the exception of FIG. 8, are not intended to be drawn to scale. In the drawings, each identical or nearly identical component that is illustrated in various figures may be represented by a like numeral. For purposes of clarity, not every component may be labeled in every drawing.

DETAILED DESCRIPTION

This disclosure is based, at least in part, on the realization that it would be advantageous to provide a PCB-based inductor that efficiently utilizes space on a printed circuit board. Numerous configurations and variations will be apparent in light of this disclosure. In accordance with some embodiments of the present disclosure, techniques are disclosed for providing a space-efficient PCB-based inductor.

Figure 1:
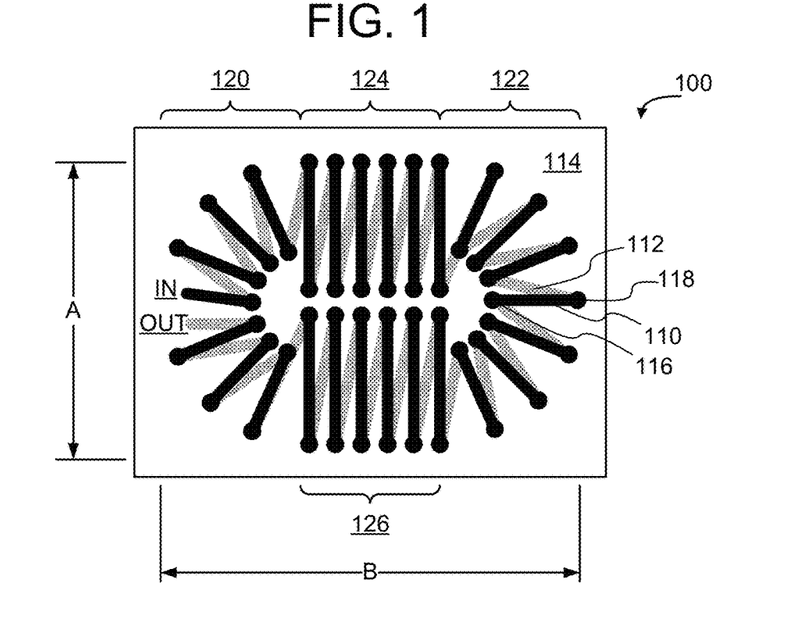
FIG. 1 is a block diagram illustrating an example space-efficient PCB-based inductor in accordance with some embodiments of the present disclosure.
Figure 2:
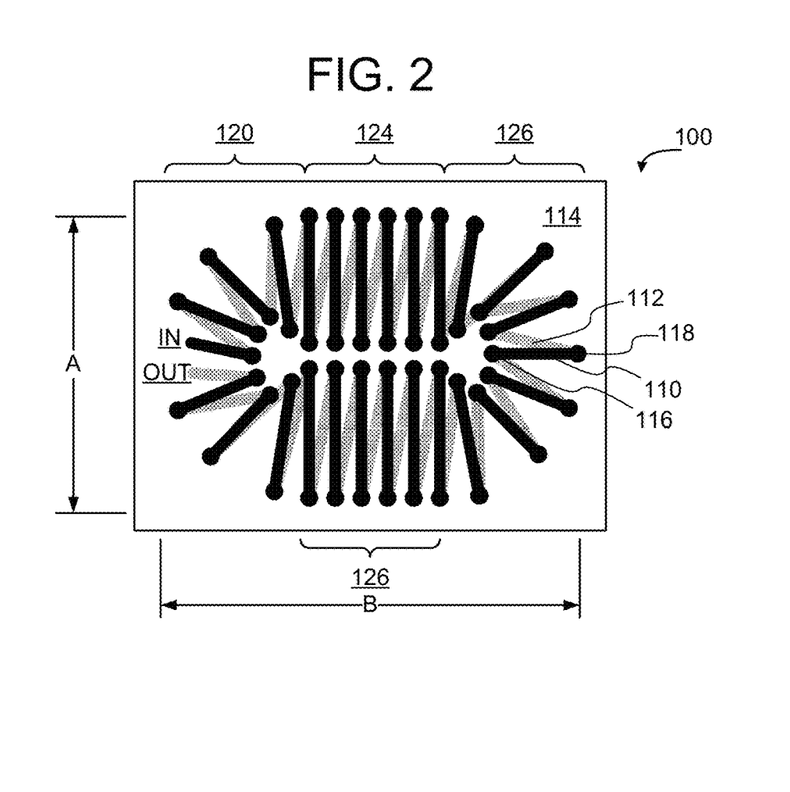
FIG. 2 is a block diagram illustrating another example space-efficient PCB-based inductor in accordance with some embodiments of the present disclosure.

FIGS. 1 and 2 show several example embodiments of space-efficient PCB-based inductors 100. As shown in FIGS. 1 and 2, the example space-efficient PCB-based inductor 100 includes top traces 110 and bottom traces 112 formed on PCB 114. In FIGS. 1 and 2, top traces 110 are shown using solid black lines and bottom traces 112 are showing using grayed out lines. Top traces 110 and bottom traces 112 may be formed on PCB 114 by etching a copper layer laminated on the surfaces of the PCB 114 or using any other conventional or to be developed manufacturing technique.

Inner vias 116 and outer vias 118 interconnect respective top traces 110 and bottom traces 112. In FIGS. 1 and 2, inner and outer vias 116, 118, are shown using connection dots. Inner and outer vias 116, 118 may be formed by drilling holes through the PCB and filling the holes with conductive material such as a conductive paste, or through another conventional or to be developed manufacturing technique.

Top traces 110, bottom traces 112, inner vias 116, and outer vias 118 are connected to form a continuous electrical path from an input (labeled IN) to an output (labeled OUT) to allow electrical current to flow through the space-efficient PCB-based inductor 100. Although the example space-efficient PCB-based inductor 100 shown in FIGS. 1 and 2 shows the input IN and output OUT formed in one of the toroidal sections 120, the input IN and output OUT may be connected to any adjacent pair of traces at any location around space-efficient PCB-based inductor 100. Likewise although input IN is shown as being connected to one of the top traces 110, input IN could instead be connected to one of the bottom traces 112 and output OUT could instead be connected to one of the top traces 110. In some implementations input IN and output OUT are both formed on the same side (top or bottom) of the PCB 114.

The space-efficient PCB-based inductor 100 includes a first toroidal end section 120, a first cylindrical side section 124, a second toroidal end section 122, and a second cylindrical side section 126. As shown in FIGS. 1 and 2, the first and second cylindrical side sections 124, 126, are connected intermediate the first and second toroidal end sections 120, 122. In some implementations the top traces 110 of the first and second cylindrical side sections 124, 126 are longer than the top traces 110 of the first and second toroidal end sections 120, 122. Likewise, in some implementations the bottom traces 111 of the first and second cylindrical side sections 124, 126 are longer than the bottom traces 111 of the first and second toroidal end sections 120, 122. In some implementations the turns of the first and second toroidal end sections 120, 122 each extend through an arc encompassing approximately 180 degrees of a circle.

In the implementations shown in FIGS. 1 and 2, the first toroidal end section 120 has seven top traces 110 and seven bottom traces 112 interconnected by inner and outer vias 116, 118, forming seven turns. Likewise the second toroidal end section 120 has seven top traces 110 and seven bottom traces 112 interconnected by inner and outer vias 116, 118, forming seven turns. The particular number of turns used to implement the first and second toroidal end sections 120, 122, will depend on the particular implementation. In some implementations the same number of turns is used in each end toroidal end section 120, 122. In some implementations a different number of turns is used in toroidal end section 120 than is used in toroidal end section 122. In some implementations, each toroidal end section 120, 122 has between 5 and 20 turns. In some implementations, each toroidal end section 120, 122 has between 5 and 8 turns.

In some implementations, as shown in FIG. 1, each toroidal end section 120, 122 has traces a first length, in which all the traces are the same length. In some implementations, as shown in FIG. 2, the traces in the toroidal end sections adjacent the cylindrical section are longer than the other traces of the toroidal end sections, but shorter than the traces of the first and second cylindrical side sections 124, 126.

In the implementations shown in FIGS. 1 and 2, the first cylindrical side section 124 and second cylindrical side section 126 each have six top traces 110 and six bottom traces 112 interconnected by inner and outer vias 116, 118, forming six turns. Different numbers of turns may be used to implement the first and second cylindrical side section 124, 126, depending on the implementation.

As used herein, the terms "toroid" and "toroidal" refer to an inductor construction in which the top traces 110 are formed to radiate generally outwardly from an approximate central focal point, and in which the bottom traces 112 are formed to radiate generally outwardly from an approximate central focal point.

As used herein, the terms "cylinder" and "cylindrical" refer to an inductor construction in which the top traces 110 are generally formed to be parallel to each other, and in which the bottom traces 112 are generally formed to be parallel to each other.

As used herein the term "turn" of the space-efficient PCB-based inductor 100 will be used to describe a set of components, including a first of the top traces 110, a first of the bottom traces 112, a first of the inner vias 116, and a first of the outer vias 118, that are electrically connected together, such that the first of the top traces 110, the first of the bottom traces 112, are electrically connected by either the first of the inner vias 116 or the first of the outer vias 118. A "turn" thus encompasses components that form one loop of an electrical path within the space-efficient PCB-based inductor 100.

FIGS. 3-6 show an example 26 turn space-efficient PCB-based inductor 100 according to some implementations. The PCB 114 has been removed to show the top traces 110, bottom traces 112, inner vias 116 and outer vias 118 more clearly. PCB 114 (not shown in FIGS. 3-6) may be a single layer PCB or a multi-layer PCB. Where the PCB 114 is a multi-layer PCB, the top traces 110 and bottom traces 112 may be formed on any desired layer of the multi-layer PCB, as long as the top and bottom traces 110, 112 are separated by at least one layer of the multi-layer PCB.

Figure 3:
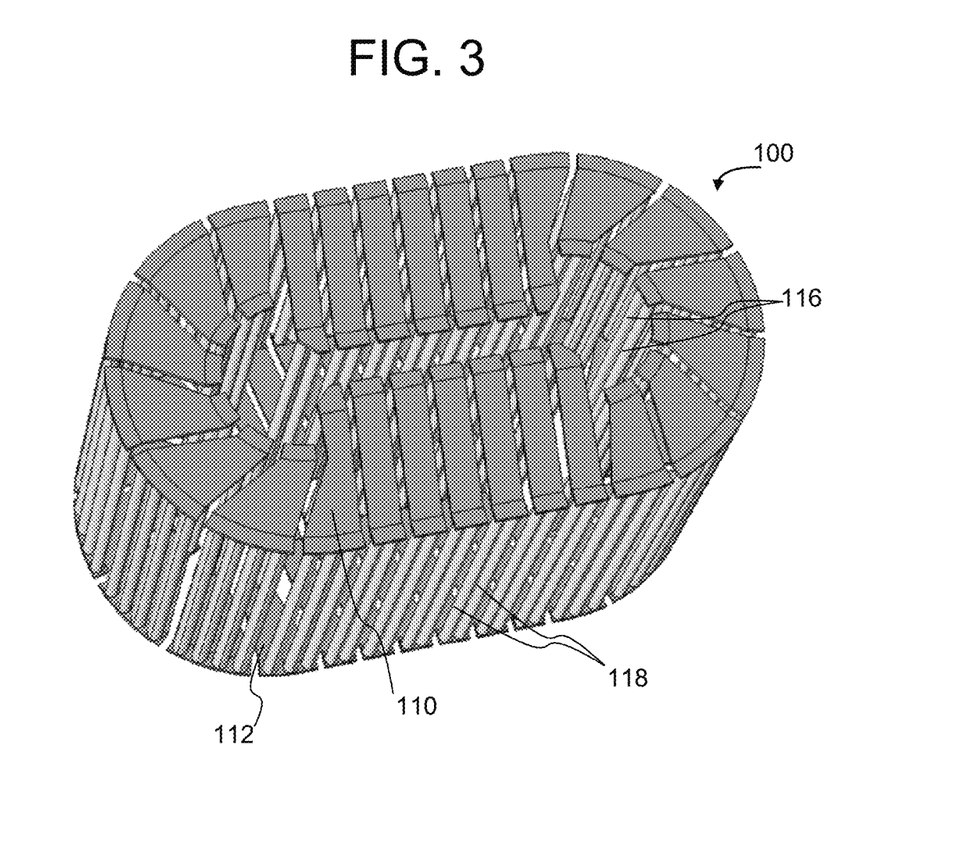
FIG. 3 is a perspective view of a three dimensional model of an example space-efficient PCB-based inductor in accordance with some embodiments of the present disclosure.
Figure 4:
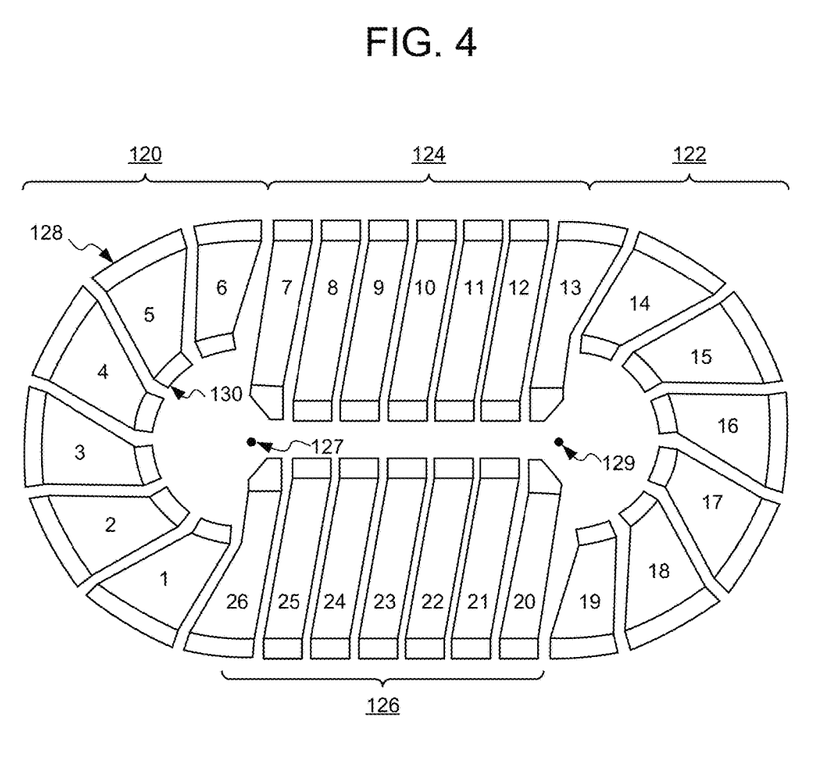
FIG. 4 is a top view of the example space-efficient PCB-based inductor of FIG. 3 in accordance with some embodiments of the present disclosure.

FIG. 4 is a top view of the space-efficient PCB-based inductor 100 of FIG. 3. Top traces 110 have been numbered 1-26 in FIG. 4, of which traces 1-6 form a first toroidal end section 120, traces 7-13 form a first side cylindrical section 124, traces 14-19 form a second toroidal end section 122, and traces 20-26 form a second side cylindrical section 126. Note that traces 1-6 of the first toroidal end section 120 are formed to radiate generally outwardly from a first approximate central focal point 127. Likewise that traces 14-19 of the second toroidal end section 122 are formed to radiate generally outwardly from a second approximate central focal point 129.

Figure 5:
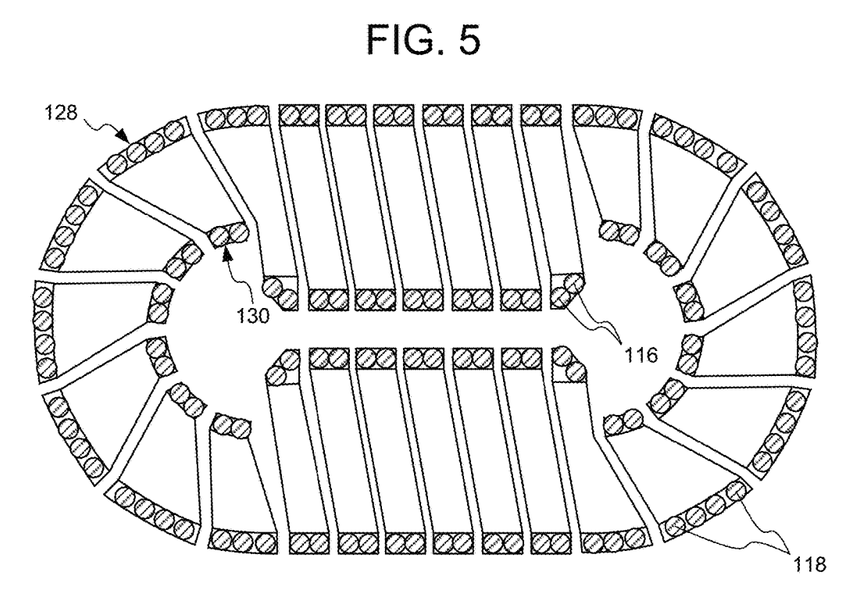
FIG. 5 is a cross-sectional view of the example space-efficient PCB-based inductor of FIG. 3 with the PCB removed to show the bottom traces, in accordance with some embodiments of the present disclosure.

As shown in FIG. 3, in some implementations inner vias 116 are formed using two or more round vias per trace. FIG. 5 shows a cross-sectional view of the space-efficient PCB-based inductor 100 of FIG. 3. To reduce resistance, it is desirable to have a large surface area interconnecting each top trace 110 with its respective bottom trace 112. As indicated in FIGS. 3 and 5, it is possible to use two or more inner vias 116, and two or more outer vias 118, to form these connections to maximize contact area for transmission of electricity between top traces and respective bottom traces 112.

In the toroidal sections 120, 122, the top traces 110 and bottom traces 112 radiate generally away from a central focal point 127, and therefore are able to have wider outer edges 128 than inner edge 130. Accordingly, it is possible to use an increased number of outer vias 118 or larger outer vias 118 on the outer edges 128 to connect the top and bottom traces 110, 112 in the toroidal sections 120, 122. Although circular vias 116, 118 are shown in FIGS. 3 and 5, in other implementations the vias may be other shapes, including rectangular, ovate, or another desired shape.

As shown in FIGS. 1-5, in some implementations the top traces 110 and bottom traces 112 of the first and second cylindrical side sections 124, 126 are longer than the top and bottom traces 110, 112 of the first and second toroidal end sections 120, 122. By forming the top traces 110 and bottom traces 112 of the first and second cylindrical side sections 124, 126 to be longer than the top and bottom traces 110, 112 of the first and second toroidal end sections 120, 122, it is possible to fill in an interior of the space-efficient PCB-based inductor 100 to better utilize space on the PCB 114.

Figure 6:
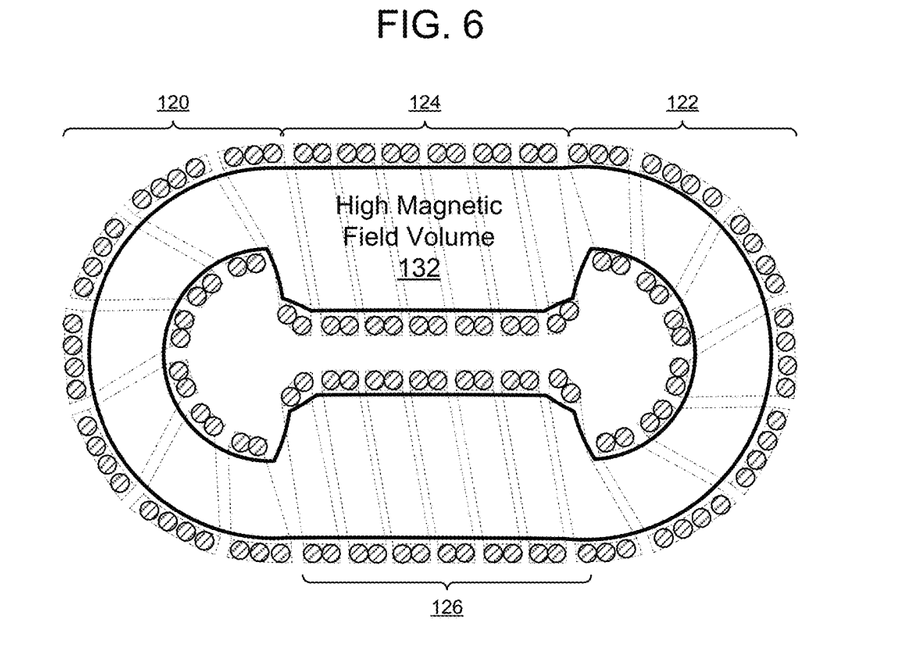
FIG. 6 is a cross-sectional view of the example space-efficient PCB-based inductor of FIG. 5 showing the magnetic field volume in accordance with some embodiments of the present disclosure.

As shown in FIG. 6, use of the combination of first and second cylindrical side section 124, 126, and first and second toroidal end sections 120, 122, allows the space-efficient PCB-based inductor 100 to have a high magnetic field volume 132 for its size. Specifically, since the linear turns of the first and second cylindrical side sections 124, 126 enclose a larger cross sectional area for flux generation, it is possible to use shorter traces in the toroidal end sections 120, 122, to greatly reduce the amount of space on PCB 114 required to implement the space-efficient PCB-based inductor 100.

Figure 7:
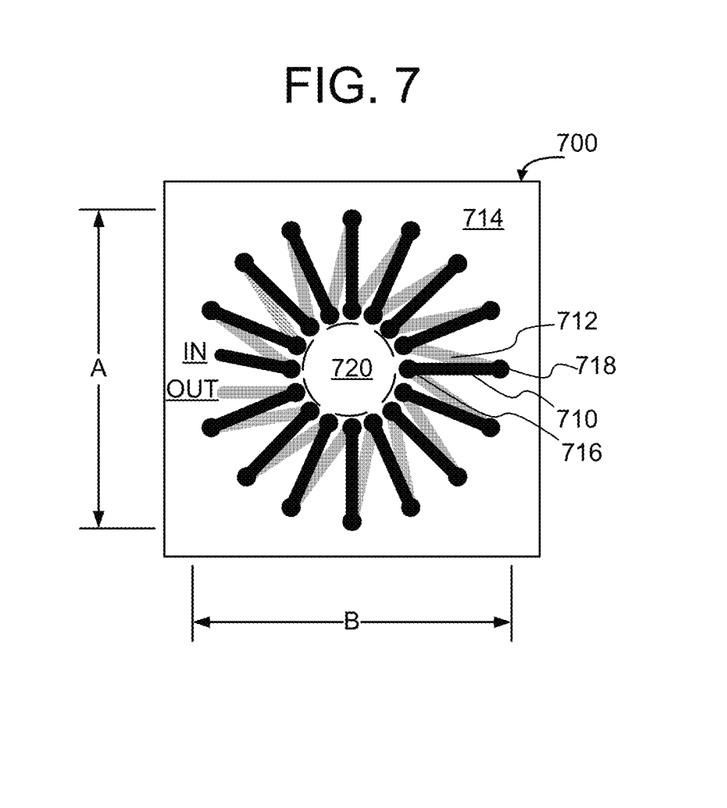
FIG. 7 is a top view of an example toroidal PCB-based inductor presented for comparison purposes.

FIG. 7 shows an example of a purely toroidal PCB-based inductor 700. The example toroidal PCB-based inductor 700 is formed from top traces 710 and bottom traces 712. In FIG. 7, top traces 710 are shown using solid black lines and bottom traces 712 are showing using grayed out lines. Top traces 710 and bottom traces 712 are formed on PCB 714 and interconnected by inner vias 716 and outer vias 718. In FIG. 7, inner and outer vias 716, 718, are shown using connection dots. Inner vias 716 are arranged in an inner circle 720 and outer vias 718 are arranged in an outer circle. The diameter of the inner circle 720 is limited by the size of the inner vias 716. The diameter of the outer circle is dictated by the length of traces required to achieve the desired inductance.

A comparison of example space-efficient PCB-based inductors 100 shown in FIGS. 1-6 with the toroidal PCB-based inductor 700 of FIG. 7 reveals that the space-efficient PCB-based inductor 100 almost fully utilizes all of the interior space allocated to it on the PCB 114 to generate magnetic flux. The toroidal PCB-based inductor of FIG. 7, by contrast, has unused space inside the inner circle 720. Further, the linear turns of the first and second cylindrical side sections 124, 126 enclose a larger cross section area for flux generation, therefore the space-efficient PCB-based inductor 100 is able to use shorter traces in the first and second toroidal end sections 120, 122, to generate a similar inductance value. This is shown in FIG. 6 where the relatively high magnetic field volume 132 of an example space-efficient PCB-based inductor 100 is shown. Additionally, because the space-efficient PCB-based inductor 100 has a shorter net overall electrical path length, the electrical resistance of the space-efficient PCB-based inductor 100 is lower when compared to toroidal PCB-based inductor generating a similar amount of inductance.

As shown in FIGS. 1-6, in some implementations the turns of the first and second cylindrical side sections 124, 126 are longer than the turns of the first and second toroidal end sections 120, 122. Different length turns, in an inductor, tend to produce magnetic field cancellation. In some implementations, transition from the toroidal end sections 120, 122, to the first and second cylindrical side sections 124, 126, happens gradually, for example as shown in FIG. 2, by using an intermediate length turn, therefore the field cancellation effects due to differences between adjacent turns may be minimized.

According to some implementations, because the number of turns in the first and second side cylindrical sections 124, 126 may be adjusted, the design is flexible and allows the space-efficient PCB-based inductor 100 to be configured to match the desired inductance value and the available area on the PCB 114.

Finite element simulation confirms the considerably reduced size of the space-efficient PCB-based inductor of FIGS. 1-6, when compared to a toroidal PCB-based inductor 700 of FIG. 7 with the same approximate inductance, number of turns, inter-trace clearance, and diameter of vias.

Several prototype space-efficient PCB-based inductors 100 were built and tested against a toroidal PCB-based inductor 700. The toroidal PCB-based inductor had an outer diameter of 314 millimeters (mm) and was formed using 24 turns and 1 mm vias. The toroidal PCB-based inductor was found to have an inductance value of 460 nanohenries (nH). Since the outer diameter of the toroidal PCB-based inductor was 314 mm, the surface area on the PCB 714 required to implement the toroidal PCB-based inductor 700 was 986 mm$^2$ (314 mm×314 mm=986 mm$^2$).

The following Table 1 summarizes the experimental results.

TABLE 1

| Prototype Number: | 1 | 2 | 3 | 4 | 5 | 6 |
| --- | --- | --- | --- | --- | --- | --- |
| Number of toroidal turns in each toroidal end section | 6 | 6 | 6 | 6 | 6 | 6 |

TABLE 1-continued

| Prototype Number: | 1 | 2 | 3 | 4 | 5 | 6 |
|---|---|---|---|---|---|---|
| Linear turns per side in each cylindrical section | 1 | 2 | 3 | 4 | 5 | 6 |
| Total turns (toroidal + cylindrical) | 14 | 16 | 18 | 20 | 22 | 24 |
| Dimension of Side A (mm) | 12.5 | 12.5 | 12.5 | 12.5 | 12.5 | 12.5 |
| Dimension of Side B (mm) | 14.75 | 15.79 | 16.82 | 17.86 | 18.9 | 19.93 |
| Area (mm$^2$) | 184.4 | 197.4 | 210.3 | 223.3 | 236.3 | 249.2 |
| Measured Inductance (nH) | 225 | 266 | 305 | 342 | 383 | 425 |

In Table 1, each prototype had a first toroidal end section 120 with six turns, and a second toroidal end section 122 that also had six turns. Thus, there were 12 toroidal turns in each prototype. Because the number of toroidal turns didn't vary, the dimension of side 1 of each prototype remained constant at 12.5 mm. Note that the outer diameter of the toroidal end sections 120, 122 is much smaller than the 315 mm outer diameter of the toroidal PCB-based inductor 700, indicating that the length of the top and bottom traces 110, 112 in the toroidal end sections 120, 122 are able to be made shorter than the traces in the toroidal PCB-based inductor 700.

The number of turns in the cylindrical side sections 124, 126 was varied, such that there were between 1 and 6 linear turns on each cylindrical side sections 124, 126 in the various prototypes.

As shown in Table 1, a space-efficient PCB-based inductor 100 with six turns in each of the cylindrical side section 124, 126, had 24 turns total, had a measured inductance value of 425 nH, and occupied 249.2 mm$^2$ of space on the PCB 114. As noted above, a 24 turn toroidal PCB-based inductor 700 formed as shown in FIG. 7 had a slightly higher (approximately 10% higher) inductance value of 460 nH, but toroidal PCB-based inductor 700 of FIG. 7 occupied almost three times the area on the PCB 714 (9.86 cm$^2$).

FIG. 8 is drawn to scale, and graphically shows the reduction in space required to implement a space-efficient PCB-based inductor 100, when compared with a toroidal PCB-based inductor 700. Specifically, FIG. 8 (left) shows the amount of area (12.5 mm×19.94 mm) on a PCB 114 required to implement a space-efficient PCB-based inductor 100, having six turns in each of the cylindrical side section 124, 126, (24 turns total), and a measured inductance value of 425 nH. FIG. 8 (right) shows the amount of area (31.35 mm×31.35 mm) on a PCB 114 required to implement a toroidal inductor 700 having 24 turns and a measured inductance value of 460 nH. As shown in FIG. 8, the space-efficient PCB-based inductor 100 requires a drastically reduced amount of space on the PCB 114, as compared to a toroidal PCB-based inductor 700 with similar inductance value.

The following reference numerals are used in the drawings:

100 space-efficient PCB-based inductor
110 top traces
112 bottom traces
114 PCB
116 inner vias
118 outer vias
120 first toroidal end section
122 second toroidal end section
124 first cylindrical side section
126 second cylindrical side section
127 first approximate central focal point
128 outer edge
129 second approximate central focal point
130 inner edge
132 magnetic field volume
700 toroidal PCB-based inductor
710 top traces
712 bottom traces
714 PCB
716 inner vias
718 outer vias
720 inner circle Although the methods and systems have been described relative to specific embodiments thereof, they are not so limited. Many modifications and variations may become apparent in light of the above teachings. Many additional changes in the details, materials, and arrangement of parts, herein described and illustrated, may be made by those skilled in the art. A number of implementations have been described. Nevertheless, it will be understood that additional modifications may be made without departing from the scope of the inventive concepts described herein, and, accordingly, other implementations are within the scope of the following claims.

What is claimed is:

1. An inductor, comprising:
  a first set of inductor turns arranged to form a first toroidal end section;
  a second set of inductor turns arranged to form a first cylindrical side section;
  a third set of inductor turns arranged to form a second toroidal end section; and
  a fourth set of inductor turns arranged to form a second cylindrical side section;
  wherein:
    the first toroidal end section, first cylindrical side section, second toroidal end section, and second cylindrical side section are connected in series; and
    the turns of the first and third sets of inductor turns each has a first length, the turns of the second and fourth sets of inductor turns each has a second length, and wherein the second length is longer than the first length.

2. The inductor of claim 1, wherein the first toroidal end section has turns that radiate generally outwardly from a first approximate central focal point, and wherein the second toroidal end section has turns that radiate generally outwardly from a second approximate central focal point.

3. The inductor of claim 2, wherein the turns of the first toroidal end section and the turns of the second toroidal end section extend through an arc encompassing approximately 180 degrees of a circle.

4. The inductor of claim 1, wherein at least some of the turns of the second set of inductor turns are longer than at least some of the turns of the first set of inductor turns.

5. The inductor of claim 1, wherein the first cylindrical side section is connected between the first and second toroidal end sections, and wherein the second cylindrical side section is connected between the second and first toroidal end sections.

6. The inductor of claim 1, wherein each turn is formed from a top wire, a bottom wire, an inner connector, and an outer connector, at least one of the inner connector and the outer connector interconnecting the top wire and bottom wire.

7. The inductor of claim 6, wherein the top and bottom wires of the turns in the first and second cylindrical side sections are longer than top and bottom wires of the turns in the first and second toroidal end sections.

8. The inductor of claim 6, wherein the top wires and bottom wires of the first toroidal end section are the same length as the top wires and bottom wires of the second toroidal end section.

* * * * *